(12) United States Patent
Kim (10) Patent No.: US 7,746,609 B2
(45) Date of Patent: Jun. 29, 2010

(54) ESD PROTECTION CIRCUIT

(75) Inventor: Kil-Ho Kim, Chungcheongbuk-do (KR)

(73) Assignee: MagnaChip Semiconductor Ltd., Chungcheongbuk-do (KR)

( * ) Notice: Subject to any disclaimer, the term of this patent is extended or adjusted under 35 U.S.C. 154(b) by 95 days.

(21) Appl. No.: 11/595,942

(22) Filed: Nov. 13, 2006

(65) Prior Publication Data

US 2007/0109698 A1    May 17, 2007

(30) Foreign Application Priority Data

Nov. 15, 2005    (KR) ...................... 10-2005-0109247

(51) Int. Cl.
*H02H 9/00*    (2006.01)
(52) U.S. Cl. ....................................................... 361/56
(58) Field of Classification Search ..................... 361/56
See application file for complete search history.

(56) References Cited

U.S. PATENT DOCUMENTS 5,744,842 A * 4/1998 Ker ............................. 257/362
5,789,964 A * 8/1998 Voldman ..................... 327/380
5,946,177 A * 8/1999 Miller et al. .................. 361/56
7,183,868 B1 * 2/2007 Wessendorf ................. 331/158
2005/0219782 A1 * 10/2005 Chen ........................... 361/91.1

FOREIGN PATENT DOCUMENTS

TW    1240403    4/2004
TW    1233210    5/2005

* cited by examiner

*Primary Examiner*—Jared J Fureman
*Assistant Examiner*—Nicholas Ieva
(74) *Attorney, Agent, or Firm*—Morgan Lewis & Bockius LLP (57) ABSTRACT

An ESD (Electro-Static Discharge) protection circuit includes a detection unit for detecting a rising time of a signal flowing into a first and a second power lines; a pre-driver for buffering an output signal of the detection unit; and a power clamp which operates in response to an output signal of the pre-driver and connects the first and the second power lines each other. The detection unit includes: an RC filter connected in series between the first and the second power lines; a first inverter for inverting an output of the RC filter; and a first capacitor, connected between the first power line and a source end of a first transistor of the first inverter, for preventing a leakage current from flowing through the first transistor and a second transistor of the first inverter when a power noise is applied to the first and the second power lines.

22 Claims, 13 Drawing Sheets

PRIOR ART

FIG. 12A

PRIOR ART

ESD PROTECTION CIRCUIT

FIELD OF THE INVENTION

The present invention relates to semiconductor technologies; and, more particularly, to an Electro-Static Discharge (ESD) protection circuit, especially a Rail Based Non-Breakdown (RBNB) ESD protection circuit.

DESCRIPTION OF RELATED ART

There is a need for immunity against a serge voltage and a serge current caused by ESD applied onto an input/output pad of a semiconductor chip. To meet such need, an ESD protection circuit is connected to the input/output pad of the semiconductor chip.

In micro chips, a technique for protecting an internal core circuit (or an output buffer/input buffer) against an ESD stress at each input/output pad can be classified into two: a Direct Pad Based ESD (DPBESD) protection circuit and a Power Rail Based ESD (PRBESD) protection circuit. In these circuits, the DPBESD protection circuit is a technique in which an ESD protection circuit coupled to an individual input/output pad copes with an ESD stress flowed thereinto. Meanwhile, the PRBESD protection circuit is a technique, in which only a bypass diode path is installed at an individual input/output pad, and which copes with an ESD stress by using a power clamp installed at a power ring between a power supply voltage and a ground voltage.

Figure 1:
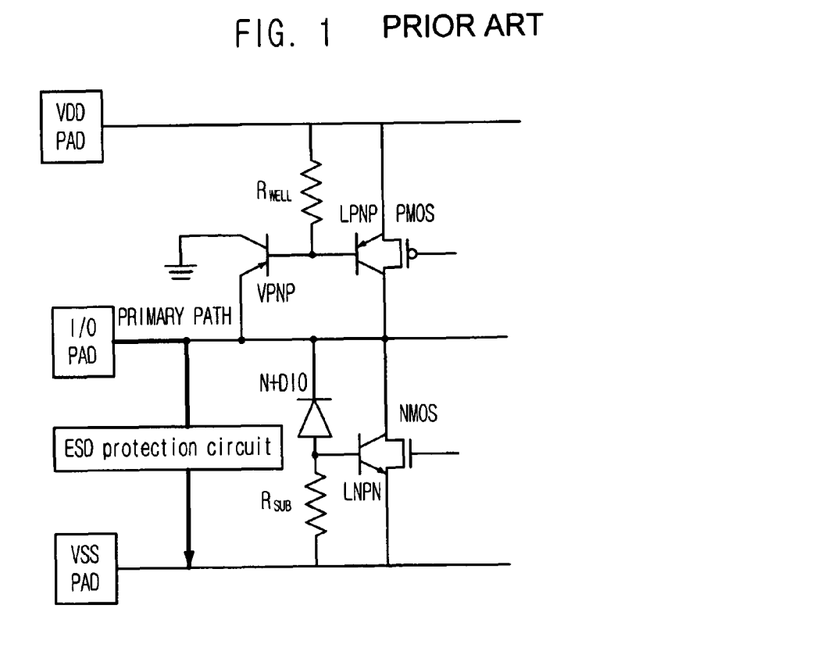
FIG. 1 is a circuit diagram for describing a conventional DPBESD protection circuit.

FIG. 1 is a circuit diagram showing a conventional DPBESD protection circuit, wherein its operational characteristic will be described below.

First of all, if a digestive capability of a stress current of an ESD protection circuit applied to each input/output (I/O) pad is good, the best ESD protection performance can be acquired. On the contrary, if a good ESD protection circuit cannot be implemented for a given technology, it is difficult to expect that a stable and efficient ESD protection performance will be acquired. Further, it is not required to consider a parasitic bus resistance between each I/O pad and a power clamp at all. Also, since an individual ESD protection circuit should be installed at each I/O pad, an efficiency of layout area is lowered. In worst cases, a layout area in which an individual ESD protection circuit can be installed at each I/O pad cannot be secured.

Figure 2:
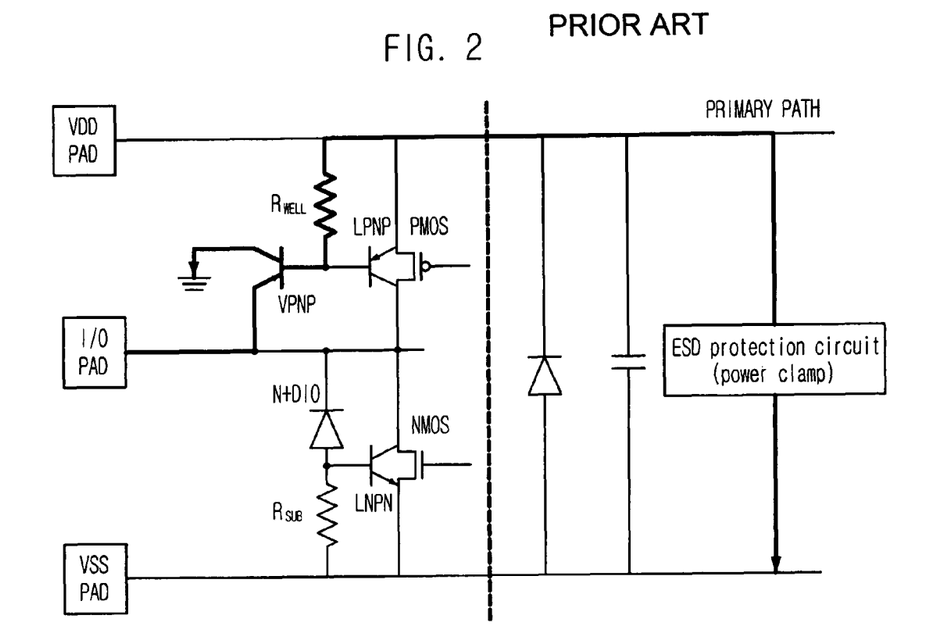
FIG. 2 shows a circuit diagram for describing an operational characteristic of a conventional PRBESD protection circuit.

FIG. 2 shows a circuit diagram for describing an operational characteristic of a conventional PRBESD protection circuit. The PRBESD protection circuit is in the spotlight as an alternative method that is able to overcome the above problems involved in the DPBESD protection circuit. The operational characteristic thereof will be given below.

Basically, since the PRBESD protection circuit does not have a structure that an ESD protection circuit corresponds to an individual I/O pad in a one to one way, it is relatively hard to acquire a stable ESD protection characteristic compared with the DPBESD protection circuit. In design aspects, a full consideration for an ESD protection networking is required. In contrast, it is possible to get the aid of a capacitance of vertical PNP BJT of CMOS device and N-well of an overall chip, in digesting an ESD stress. In particular, if a parasitic bus resistance (including resistance of forward direction operation diode path) between each I/O pad and a power clamp is too large, a stress current flows into the core circuit (or output buffer/input buffer) prior to operation of an ESD protection power clamp, which may cause any problem. However, since it does not need to install an individual ESD protection circuit at each I/O pad separately, an efficiency of layout area is high.

In the PRBESD protection circuit, particularly, a Non-Breakdown (NB) type power clamp is employed as a device that deals with an ESD stress current, and is called RBNB ESD protection circuit. This RBNB ESD protection circuit generally adopts a method that makes an active clamp by using a normal operation of a big MOS transistor. Therefore, a triggering circuit for the power clamp MOS transistor is needed. Further, it uses a saturation current (drain current) of the normal MOS transistor and thus requires a large active width, which has a low efficiency in layout area. However, because a triggering voltage of the power clamp MOS transistor is low under an ESD stress circumstance, there is a little risk that the core circuit (or output buffer/input buffer) may be damaged.

Figure 3:
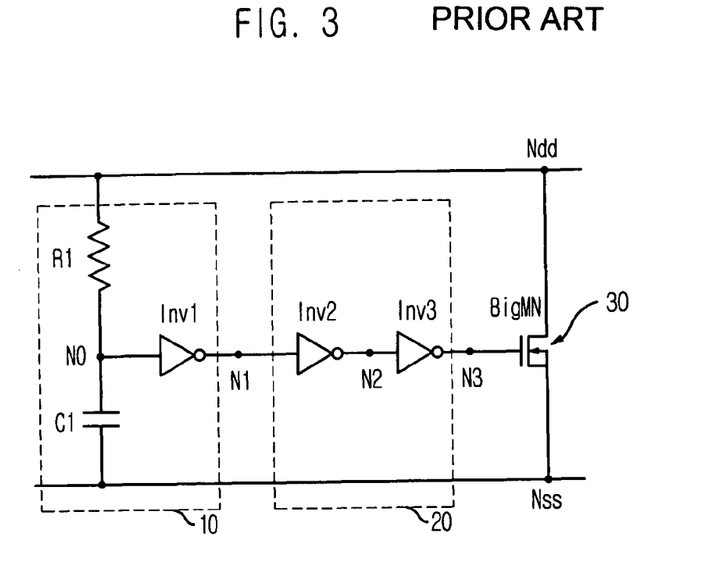
FIG. 3 is a circuit diagram for describing the so-called 1RC3Inv_std ESD protection circuit which is one of generally used RBNB ESD protection circuits.

FIG. 3 is a circuit diagram specifying a configuration and its operation principle of the so-called 1RC3Inv_std ESD protection circuit which is one of generally used RBNB ESD protection schemes.

As shown therein, the 1RC3Inv_std ESD protection circuit is provided with a rising time detector 10 for detecting a rising time of voltage taken between Ndd and Nss lines, a pre-driver 20 for driving an output of the rising time detector 10, and a power clamp 30 that operates in response to a signal driven by the pre-driver 20 and controls a flow of current between the Ndd and Nss lines.

The rising time detector 10 is constituted by one RC filter in which a resistor R1 and a capacitor C1 are coupled in series between the Ndd and Nss lines, and an inverter Inv1 for inverting a voltage at a node N0 to output an inverted voltage. The pre-driver 20 is composed of two inverters Inv2 and Inv3 coupled in series in a chain form for buffering an output of the rising time detector 10. The power clamp 30 is composed of a big MOS transistor BigMN that operates by taking an output voltage from the pre-driver 20 via its gate. The rising time detector 10 and the pre-driver 20 is a boosting circuit for driving the big MOS transistor BigMN in the power clamp 30. An operational characteristic thereof will be given below.

First, the rising time detector 10 detects a rising time with the RC filter and the inverter Inv1, and at the same time serves as an on-time controller. A time constant R1C1 of the RC filter approaches to an ESD stress duration. The pre-driver 20 composed of the two inverters Inv2 and Inv3 applies a bias voltage to the gate of the big MOS transistor BigMN that functions as the power clamp 30.

In the 1RC3Inv_std ESD protection circuit having the configuration as mentioned above, when a voltage difference between the Ndd and Nss lines varies as a function of time, a voltage at the node N0 has a delay corresponding to a time constant (ESD stress duration) given by R1C1 in the RC filter, and follows a voltage difference between the Ndd and Nss lines. Due to this, the following operation is performed for each of an ESD stress, a normal power ramp-up, and a normal power ON circumstances.

First, in case of the ESD stress circumstance, when an ESD stress having a conventional rising time ($\ll R1C1$) and duration ($\leq R1C1$) is applied between the Ndd and Nss lines in a state that power is not applied therebetween (i.e., Vdd=0 and Vss=0), the nodes N0, N1, N2, and N3 become logic low, logic high, logic low, and logic high, respectively, during the rising time and duration of the ESD stress. That is, the node N0 becomes logic low, the node N1 becomes logic high, the node N2 becomes logic low, and the node N3 becomes logic high. Thus, the big MOS transistor BigMN of the power clamp 30 is kept in a turn-on state. As a result, the big MOS transistor BigMN operates, which copes with the ESD stress current.

In case of the normal power ramp-up circumstance, when a power ramped-up at a speed slower than the time constant R1C1 of the RC filter is applied between the Ndd and Nss lines in a state that power is not applied therebetween (i.e., Vdd=0 and Vss=0), the node N0 is kept in logic low state at an initial ramp-up. But, since Ndd is not sufficiently in logic high state, the big MOS transistor BigMN is kept in a turn-off state, thereby passing no current through the big MOS transistor BigMN. On the contrary, in case where the ramp-up is sufficiently under way by passing more time than the time constant R1C1, if the node N0 is logic high and Ndd is in logic high state, the node N1 becomes logic low, the node N2 becomes logic high, and the node N3 becomes logic low, thereby keeping the big MOS transistor BigMN in a turn-off state. Accordingly, no current becomes flowed through the big MOS transistor BigMN.

In case of the normal power-ON circumstance, in a state that a normal power is applied between the Ndd and Nss lines (i.e., Vdd=3.3V and Vss=0V), the node N0 basically becomes logic high, the node N1 becomes logic low, the node N2 becomes logic high, and the node N3 becomes logic low. Thus, the big MOS transistor BigMN is kept in a turn-off state. As a result, the big MOS transistor BigMN does not operate, which passes no current therethrough.

Figure 4A:
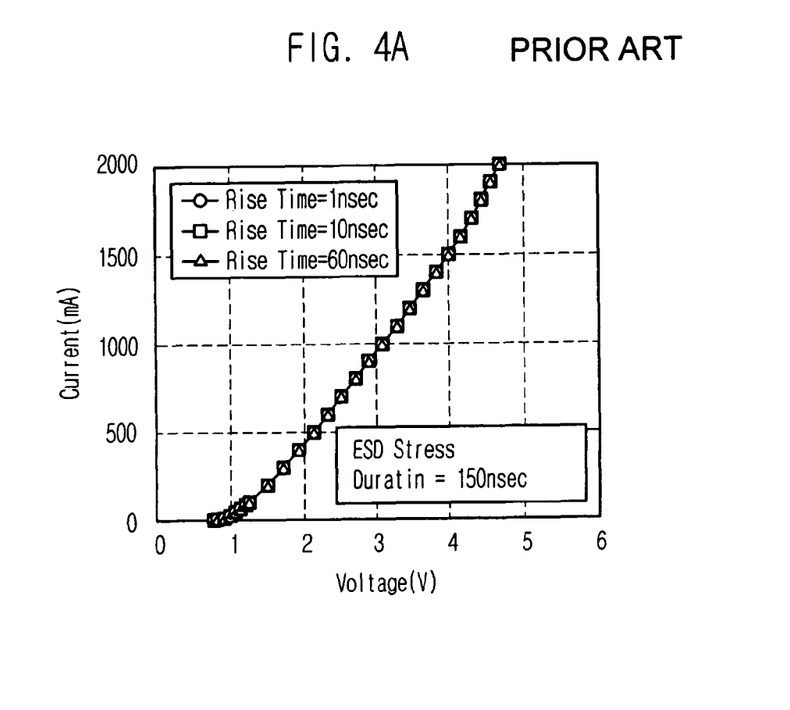
FIGS. 4A and 4B are views for describing operational characteristics in a state that the 1RC3Inv_std ESD protection circuit shown in FIG. 3 operates under the ESD stress circumstance and the normal operation circumstance.
Figure 4B:
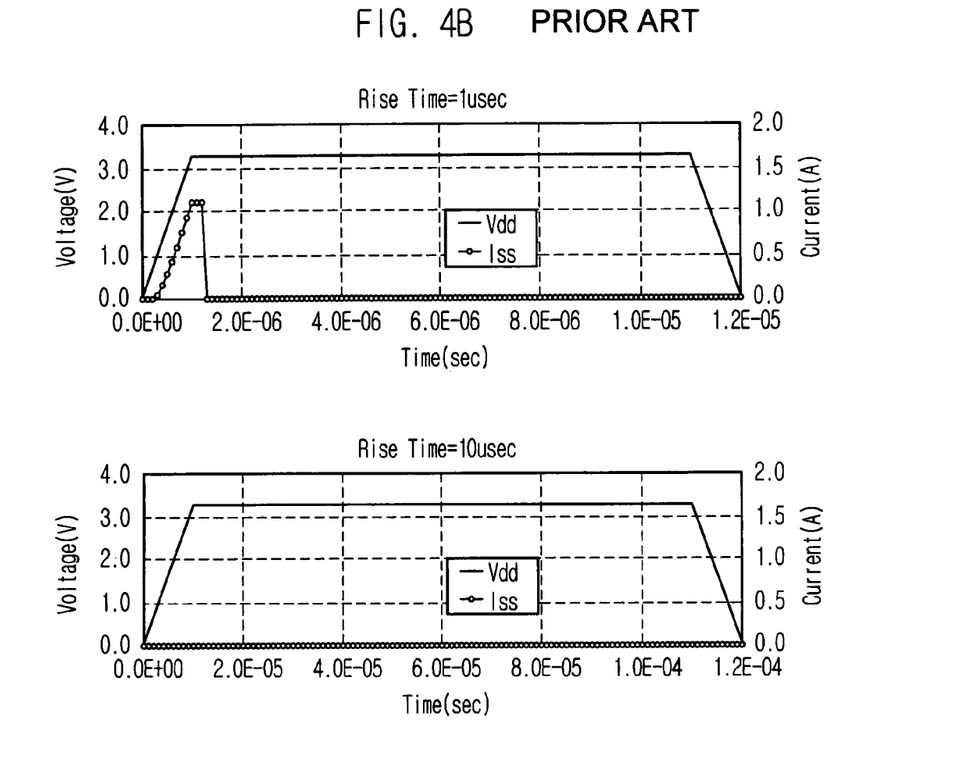

FIGS. 4A and 4B are views for describing a state that the 1RC3Inv_std ESD protection circuit shown in FIG. 3 operates under the ESD stress circumstance and the normal operation circumstance. That is, FIG. 4A is a view related to the EDS stress circumstance, and FIG. 4B is a view related to the normal operation circumstance.

In general, the ESD stress current represents characteristics that the stress rising time is below about 100 ns. As shown in FIG. 4A, it can be seen that when an ESD stress current flows into a power line between the Ndd and Nss lines, the big MOS transistor BigMN of the 1RC3Inv_std ESD protection circuit operates, thus efficiently coping with the ESD stress current.

Further, as shown in FIG. 4B, if a power ramp-up time is more than 10 μs when power is ramped-up between the Ndd and Nss lines, current does not flow between the Ndd and Nss lines of the 1RC3Inv_std ESD protection circuit. This implies that no leakage current flows between the Ndd and Nss lines.

As mentioned above, the 1RC3Inv_std ESD protection circuit shown in FIG. 3 operates the big MOS transistor MigMN under the ESD stress circumstance to cope with the ESD stress current, and does not operate the big MOS transistor MigMN under the normal operation circumstance to prevent issuance of leakage current in the power line between the Ndd and Nss lines. Accordingly, it can be used as the ESD protection circuit for protecting internal circuits of a semiconductor chip.

However, the 1RC3Inv_std ESD protection circuit has a drawback in that it sensitively reacts to a power noise. Namely, in a state that a normal power is applied between the Ndd and Nss lines (i.e., Vdd=3.3V and Vss=0V), since the node N0 is basically kept in logic high state, a channel of a PMOS transistor constituting the inverter Inv1 is close, while a channel of an NMOS transistor of the inverter Inv1 is open. In this state, if noise varied at a speed faster than the time constant R1C1 is applied between the Ndd and Nss lines, the voltage at the node N0 does not follow noise swing of voltage on the Ndd line due to time delay caused by the time constant R1C1. Thus, the channel of the PMOS transistor of the inverter Inv1 may be open. At this time, since the node N0 is kept in logic high state, the channel of the NMOS transistor of the inverter Inv1 is already in an open state. Accordingly, leakage current may flow through the inverter Inv1.

In most semiconductor chips, a power noise occurs in a power line operating a chip due to effects of an overall system or of operation in the chip. This noise has amplitude of about ±1.0 V or more, and its transition speed, i.e., a rising time or falling time is about 10 to 100 ns, which is similar to that of the ESD stress. According to the actual simulation analysis, in a state that a voltage between the Ndd and Nss power lines is kept at 3.3 V (i.e., Vdd=3.3V and Vss=0V), if noise of 1.2 V peak voltage is applied to Vdd and at this time Vdd a swing range is from 2.1 to 4.5 V, the 1RC3Inv_std ESD protection circuit shows that leakage current is induced between the Ndd and Nss power lines in a region in which a power noise peak voltage is +1.0 V. Even if the speed of the power noise is similar to that of the ESD stress current, no leakage current flows through the big MOS transistor BigMN since the node N3 is always kept in logic low state. Instead, the leakage current occurs through the PMOS and NMOS transistors constituting the inverter Inv1, as shown in FIGS. 5A to 5C to be described below.

Figure 5A:
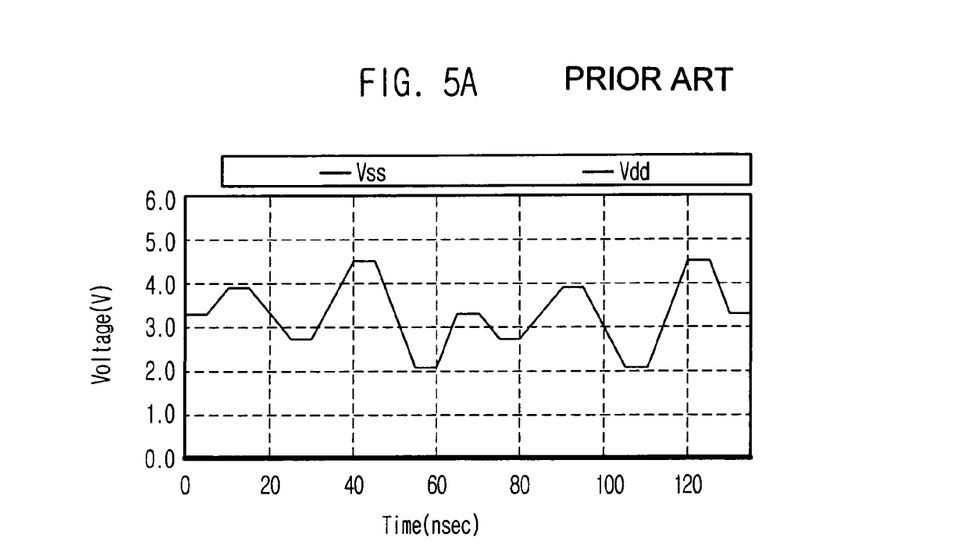
FIGS. 5A, 5B and 5C are views for explaining leakage current characteristics of the 1RC3Inv_std ESD protection circuit shown in FIG. 3 against the power noise.
Figure 5B:
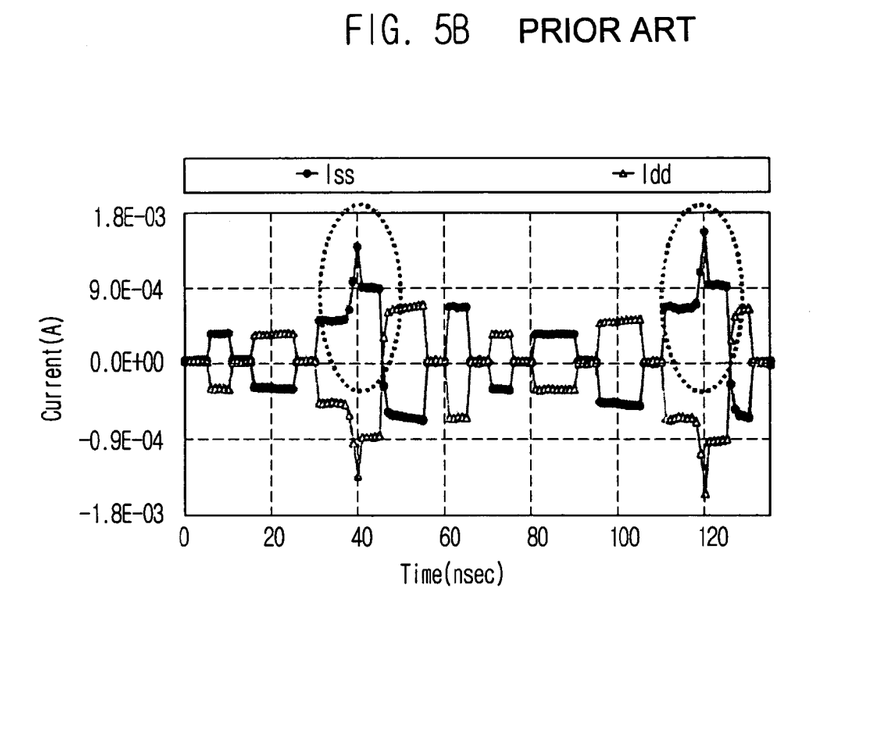
Figure 5C:
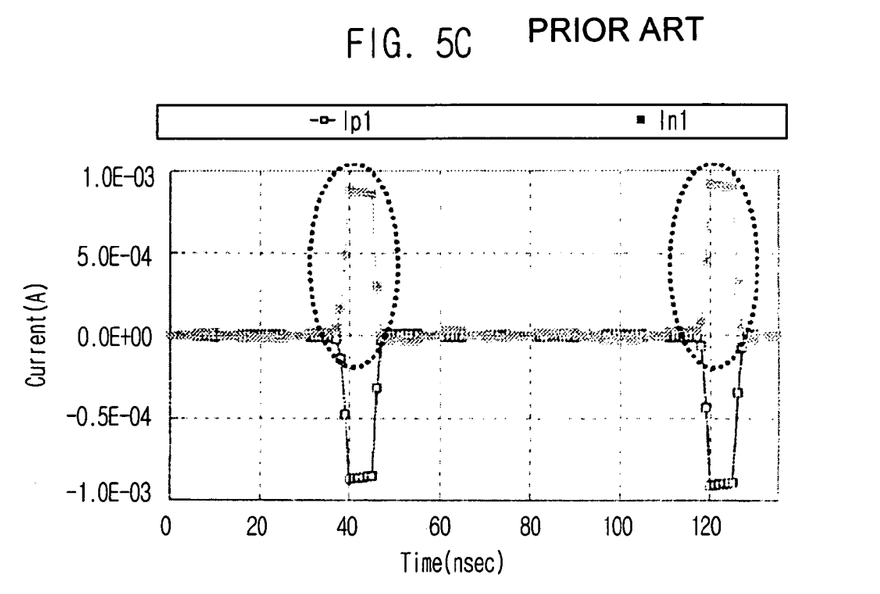

FIGS. 5A to 5C are views for explaining a state that the 1RC3Inv_std ESD protection circuit operates under the power noise circumstance. That is, FIG. 5A is a view related to a power noise between the Ndd and Nss lines, FIG. 5B is a view related to a leakage current flowing between the Ndd and Nss lines, and FIG. 5C is a view related to a leakage current flowing through the PMOS and NMOS transistors of the inverter Inv1. Here, "Vss" denotes a voltage applied to Nss, "Iss" indicates a current being flowed into Nss, "Ip1" indicates a leakage current flowing through the PMOS transistor of the inverter Inv1, "Vdd" denotes a voltage applied to Ndd, "Idd" indicates current being flowed into Ndd, and "In1" indicates a leakage current flowing through the NMOS transistor of the inverter Inv1. And, regions indicated by dot lines in FIGS. 5B and 5C are the ones corresponding to the leakage current.

The leakage current flowing between the Ndd and Nss lines via a path formed by the inverter Inv1 of the 1RC3Inv_std ESD protection circuit may cause a malfunction of a semiconductor chip. Further, although the malfunction of the chip is not taken place, the leakage current between the power and the ground intermittently occurs by the power noise in the operation state of the chip, which may be a reason of power consumption.

SUMMARY OF THE INVENTION

It is, therefore, an object of the present invention to provide an ESD protection circuit which properly operates under an ESD stress current circumstance and a normal operation circumstance while inducing no leakage current against a power noise.

In accordance with the present invention, there is provided an ESD protection circuit, including: a detection unit for detecting a rising time of a signal flowing into a first and a second power lines; a pre-driver for buffering an output signal of the detection unit; and a power clamp which operates in response to an output signal of the pre-driver and connects the first and the second power lines each other, wherein the detection unit includes: an RC filter connected in series between the first and the second power lines; a first inverter for inverting an output of the RC filter; and a first capacitor, connected between the first power line and a source end of a first transistor of the first inverter, for preventing a leakage current from flowing through the first transistor and a second transistor of the first inverter when a power noise is applied to the first and the second power lines.

The other objectives and advantages of the invention will be understood by the following description and will also be appreciated by the embodiments of the invention more clearly. Further, the objectives and advantages of the invention will readily be seen that they can be realized by the means and its combination specified in the claims.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, preferred embodiments of the present invention will be described in detail with reference to the accompanying drawings so that the invention can readily be carried out by those in the art. Further, like reference numerals designate like elements performing like functions throughout the specification.

Figure 6:
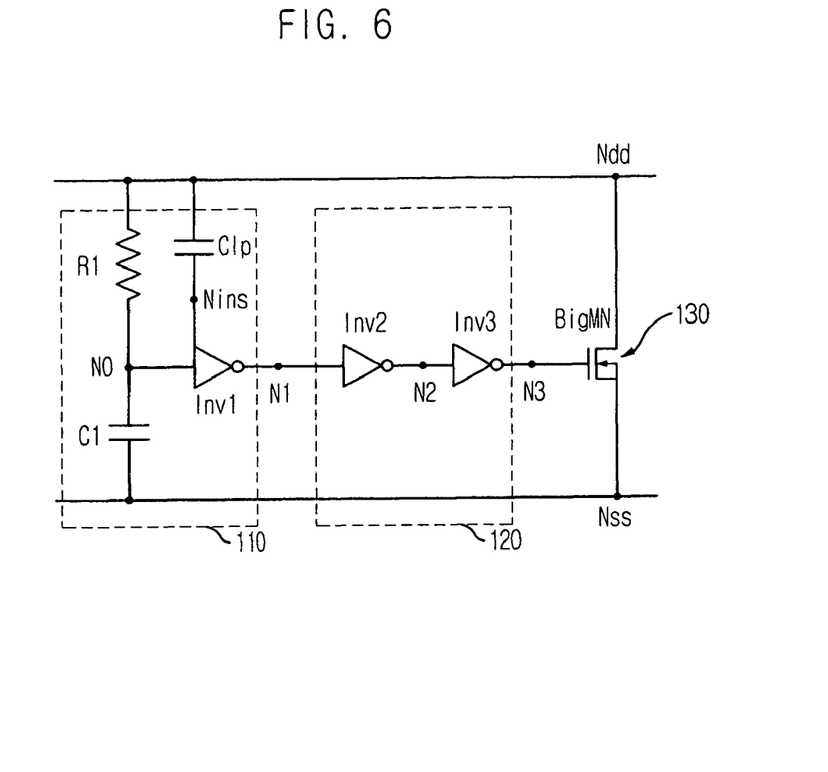
FIG. 6 illustrates a circuit diagram for describing an RBNB ESD protection circuit in accordance with a first embodiment of the present invention.

FIG. 6 illustrates a circuit diagram for describing a configuration and its operation principle of an RBNB ESD protection circuit in accordance with a first embodiment of the present invention, wherein it is called 1RC3Inv_LPC ESD protection circuit and LPC means "Leakage Prevention Capacitor".

Figure 7:
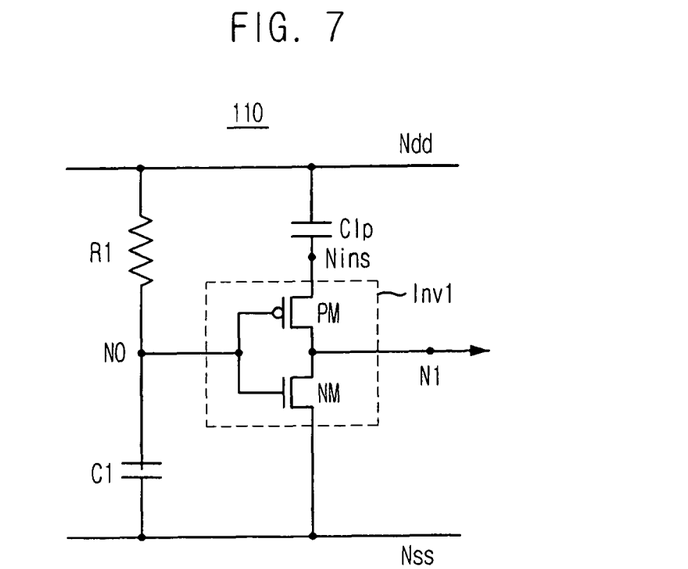
FIG. 7 is a detailed circuit of the inverter included in the rising time detector shown in FIG. 6.

Referring to FIG. 6, the RBNB ESD protection circuit fundamentally cuts off a leakage current path by additionally installing a capacitor Clp between Ndd and source of a PMOS transistor PM (see FIG. 7) of an inverter Inv1 of the 1RC3Inv_std protection circuit.

That is, in order to cut off a leakage current flowing through a PMOS transistor PM and an NMOS transistor NM of an inverter Inv1 constituting a rising time detector 110 that detects a rising time of an ESD stress current when a noise varied at a speed faster than a time constant of an RC filter is applied between Ndd and Nss lines, the RBNB ESD protection circuit in accordance with the first embodiment of the invention connects a capacitor Clp between the source end of the PMOS transistor PM and the Ndd line.

Basically, the RBNB ESD protection circuit according to the first embodiment of the invention should be designed in such a way that all other characteristics such as ESD stress circumstance or normal operation circumstance, in addition to the function of cutting off the leakage current induced by the power noise, particularly an operation state of the big MOS transistor BigMN is maximally similar to that of the 1RC3Inv_std protection circuit. In order to acquire the above characteristics, the protection circuit should be designed in a manner that a voltage Vins at a node Nins approaches a voltage Vdd at a node Ndd in all circumstances such as the ESD stress circumstance or normal operation circumstance.

In general, in non-transient circumstance, it may be represented by: "Vins=Vdd×Clp/(Clp+Cinv1)". Here, Cinv1 denotes a net parasitic capacitor of the inverter Inv1. Thus, the capacitor Clp added between the Ndd line and the source of the PMOS transistor PM of the inverter Inv1 should be set to have a relatively large value compared with the parasitic capacitor Cinv1 of the inverter Inv1. To make the capacitor Clp large, however, an optimized design considering performance to layout area is required due to much consumption of the layout area.

In the RBNB ESD protection circuit according to the first embodiment of the invention, when a voltage difference between the Ndd and Nss lines is varied as a function of time, a voltage at the node N0 follows the voltage difference between the Ndd and Nss lines with a delay of a time constant R1C1 (i.e., ESD stress duration) due to an RC filter. Accordingly, in case of installing the capacitor Clp additionally, a maximum value of a voltage V1 at a node N1 is limited below Vdd, but the overall performance of the 1RC3Inv_LPC ESD protection circuit is kept to be almost identical to that of the 1RC3Inv_std protection circuit since the effect of capacitor Clp is abruptly decreased as it goes to the right node, i.e., in the order of N2 and N3.

More concretely, each of an ESD stress circumstance, a normal power ramp-up circumstance, and a normal power-ON circumstance is operated as follows.

First, in case of the ESD stress circumstance, when an ESD stress having a rising time (<<R1C1) and duration (≦R1C1) is applied between the Ndd and Nss lines in a state that a power is not applied therebetween (i.e., Vdd=0V and Vss=0V), the nodes (N0, N1, N2, and N3) become logic low, Vins, logic low, and logic high, respectively, during the rising time and duration of the ESD stress. That is, the node N0 becomes logic low, the node N1 becomes Vins, the node N2 becomes logic low, and the node N3 becomes logic high, thereby keeping the big MOS transistor BigMN in a turn-on state. As a result, the big MOS transistor BigMN operates, which copes with the ESD stress current.

In case of the normal power ramp-up circumstance, when a power ramped-up at a speed slower than the time constant R1C1 is applied between the Ndd and Nss lines in a state that a power is not applied therebetween (i.e., Vdd=0 and Vss=0), the node N0 is kept in logic low state at an initial ramp-up. But, since Ndd is not sufficiently in logic high state, the big MOS transistor BigMN is kept in turn-off state, thereby passing no current through the big MOS transistor BigMN. On the contrary, in case where the ramp-up is sufficiently under way by passing more time than the time constant R1C1, if the node N0 is logic high and Ndd is in logic high state, the node N1 becomes logic low, the node N2 becomes logic high, and the node N3 becomes logic low, thereby keeping the big MOS transistor BigMN in a turn-off state. Accordingly, no current becomes flowed through the big MOS transistor BigMN.

In case of the normal power-ON circumstance, in a state that a normal power is applied between the Ndd and Nss lines (i.e., Vdd=3.3V and Vss=0V), the node N0 basically becomes logic high, the node N1 becomes logic low, the node N2 becomes logic high, and the node N3 becomes logic low. Thus, the big MOS transistor BigMN is kept in a turn-off state. As a result, the big MOS transistor BigMN does not operate, which passes no current therethrough.

Figure 8A:
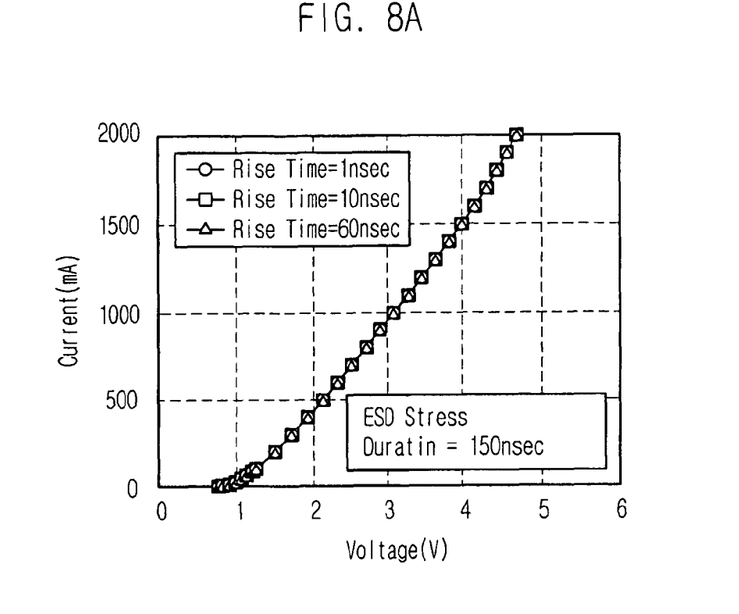
FIGS. 8A and 8B are views for describing operational characteristics in a state that the 1RC3Inv_std ESD protection circuit shown in FIG. 6 operates under the ESD stress circumstance and the normal operation circumstance.
Figure 8B:
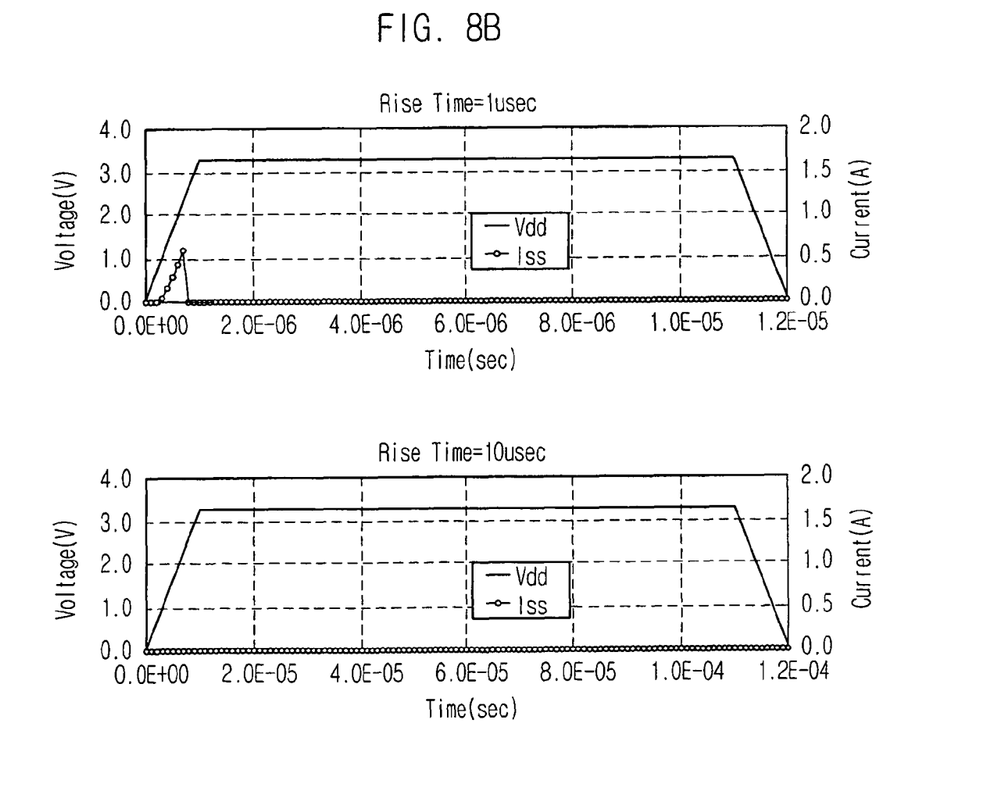

FIGS. 8A and 8B are views for describing a state that the 1RC3Inv_std ESD protection circuit shown in FIG. 6 operates under the ESD stress circumstance and the normal operation circumstance. That is, FIG. 8A shows the EDS stress circumstance, wherein "current" means a total current flowing between the Ndd and Nss lines and "voltage" means a voltage taken therebetween. And, FIG. 8B shows the normal operation circumstance, wherein "Idd" means a total current flowing between the Ndd and Nss lines and "Vdd" means a voltage taken therebetween.

Referring to FIG. 8A, it can be seen that when the ESD stress current is applied to a power line between the Ndd and Nss lines, the 1RC3Inv_LPC ESD protection circuit efficiently copes with the ESD stress current by operation of the big MOS transistor BigMN. Further, referring to FIG. 8B, it can be seen that when a power is ramped-up in a power line between the Ndd and Nss lines, no current flows between the Ndd and Nss lines of the 1RC3Inv_std ESD protection circuit if the power ramp-up time is above 10 μs. Namely, this implies that no leakage current occurs between the Ndd and Nss lines. In view of the above results, it can be found that the 1RC3Inv_LPC ESD protection circuit according to the first embodiment of the invention also operates properly for both the ESD stress current circumstance and the normal operation circumstance.

Figure 9A:
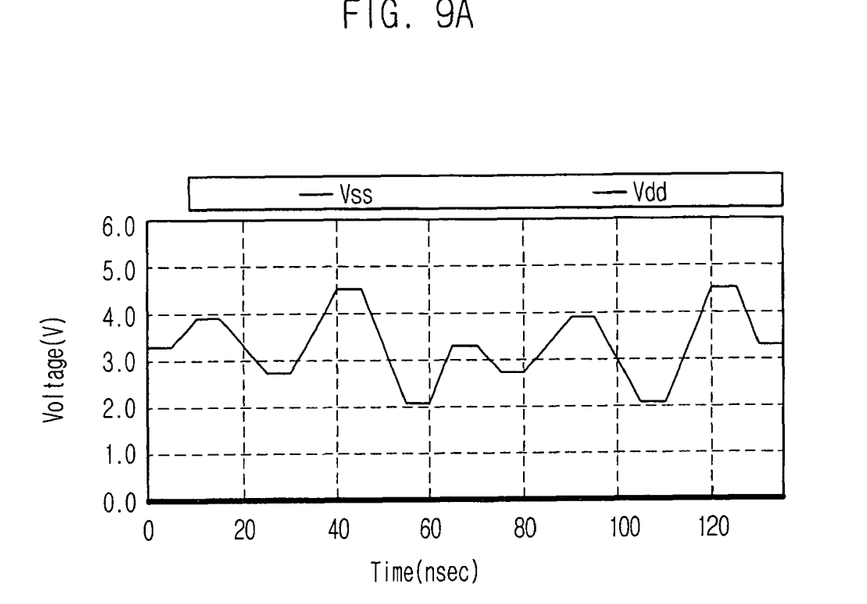
FIGS. 9A, 9B and 9C are views for describing leakage current characteristics of the 1RC3Inv_LPC ESD protection circuit shown in FIG. 6 against the power noise.
Figure 9B:
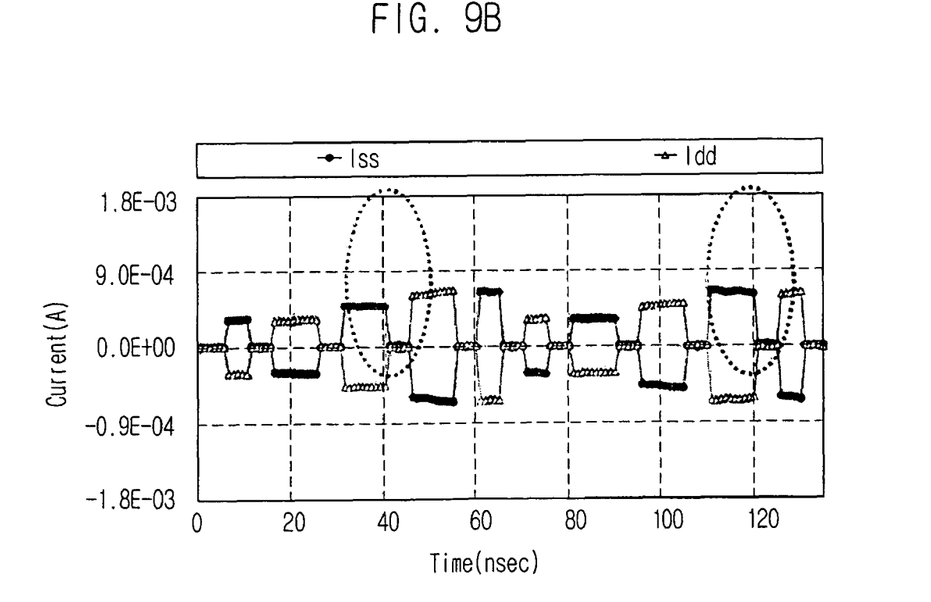
Figure 9C:
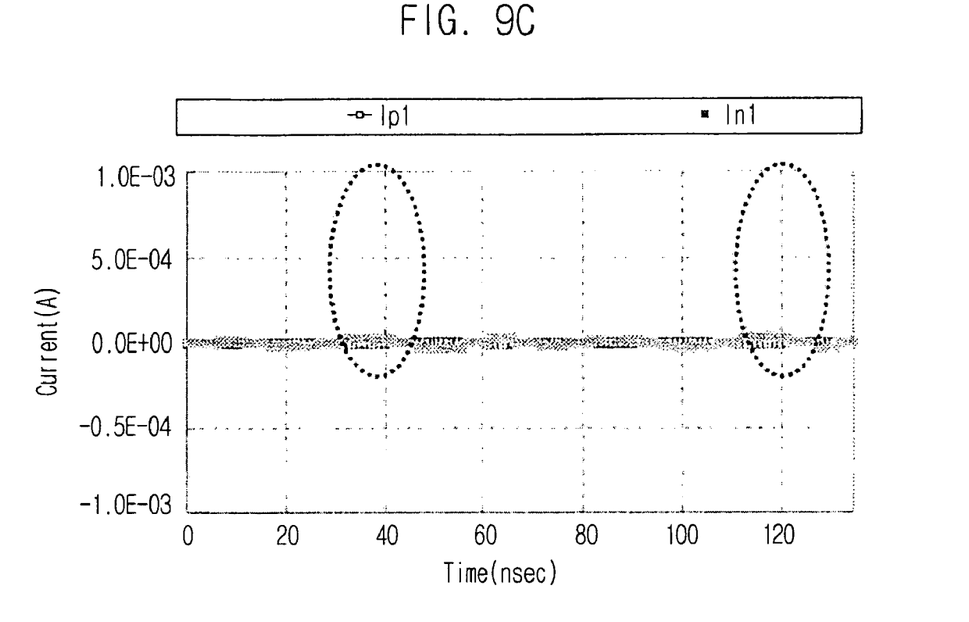

FIGS. 9A to 9C are views for describing a state that the 1RC3Inv_LPC ESD protection circuit according to the first embodiment of the invention operates under the power noise circumstance. That is, FIG. 9A is a view related to a power noise between the Ndd and Nss lines, FIG. 9B is a view related to a leakage current flowing between the Ndd and Nss lines, and FIG. 9C is a view related to a leakage current flowing through the PMOS transistor and NMOS transistor of the inverter Inv1. Here, "Vss" denotes a voltage applied to the Nss line, "Iss" indicates a current flowing on the Nss line, "lp1" indicates a leakage current flowing through the PMOS transistor of the inverter Inv1, "Vdd" denotes a voltage applied to Ndd, "Idd" indicates a current flowing into Ndd, and "ln1" indicates a leakage current flowing through the NMOS transistor of the inverter Inv1. And, regions indicated by dot lines in FIGS. 9B and 9C are the ones corresponding to the leakage current.

Referring to FIGS. 9A to 9C, it can be confirmed that since the 1RC3Inv_LPC ESD protection circuit according to the first embodiment of the invention fundamentally cuts off a leakage current path of the inverter Inv1 through the capacitor Clp, the leakage current that was taken place in the 1RC3Inv_std ESD protection circuit is not occurred at all.

The 1RC3Inv_LPC ESD protection circuit according to the first embodiment of the invention as configured above properly operates under the ESD stress current circumstance and the normal operation circumstance, and also has characteristics that no leakage current is induced against the power noise.

Figure 10:
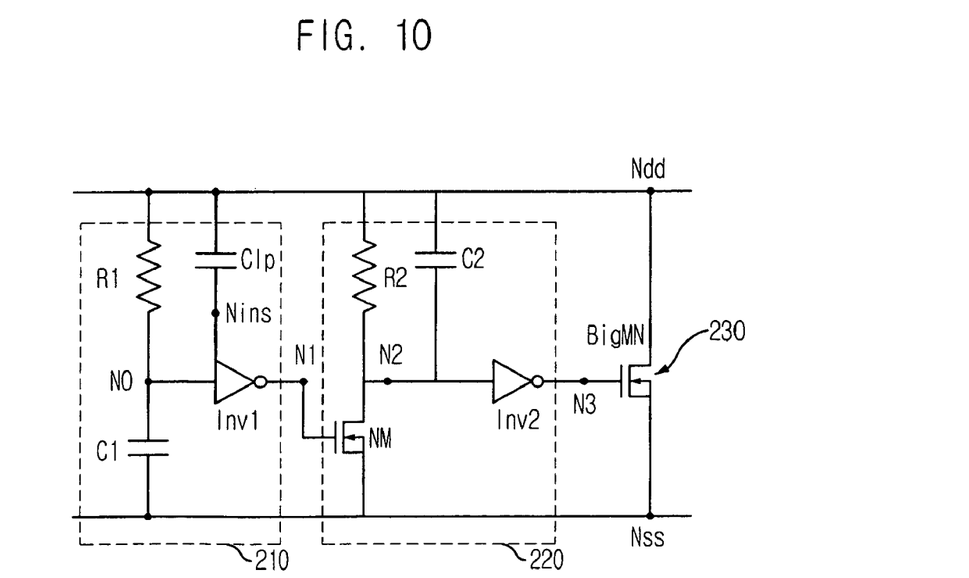
FIG. 10 illustrates a circuit diagram for describing an RBNB ESD protection circuit in accordance with a second embodiment of the present invention.

FIG. 10 illustrates a circuit diagram for describing a configuration and its operation principle of an RBNB ESD protection circuit in accordance with a second embodiment of the present invention. Here, FIG. 10 presents an embodiment in which the technical principle of the first embodiment as mentioned above is applied to a 2RC2Inv_std ESD protection circuit.

Figure 11:
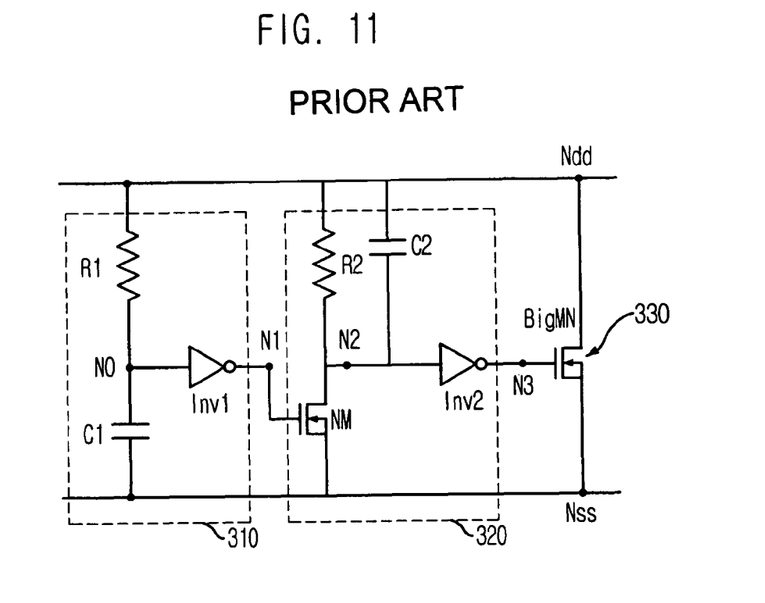
FIG. 11 is a comparative circuit diagram for comparing its operational characteristic with an operational characteristic of the RBNB ESD protection circuit shown in FIG. 10.

In order to help understand a configuration of an RBNB ESD protection circuit according to the second embodiment of the invention shown in FIG. 10, a configuration of a conventional 2RC2Inv_std ESD protection circuit is shown in FIG. 11.

As depicted in FIG. 11, the conventional 2RC2Inv_std ESD protection circuit is another type of the RBNB ESD protection circuit. Unlike the 1RC3Inv_std ESD protection circuit shown in FIG. 3, the conventional 2RC2Inv_std ESD protection circuit is comprised of two resistors R1 and R2, two capacitors C1 and C2, two inverters Inv1 and Inv2, and one NMOS transistor NM as a boosting circuit for operating a big MOS transistor BigMN of a power clamp 330. That is, a rising time detector 310 is composed of an RC filter R1 and C1 and an inverter Inv1, and a pre-driver 320 is composed of a resistor R2 coupled between Ndd and the node N2, a capacitor C2 coupled in parallel to the resistor R2, a transistor NM that operates in response to an output of the inverter Inv1 and connects the resistor R2 and Nss, and an inverter Inv2 for inverting a voltage at the node N2. The power clamp 330 is composed of a big MOS transistor BigMN that operates in response to an output of the inverter Inv2 and connects the Ndd and Nss lines. Since the conventional 2RC2Inv_std ESD protection circuit having the above-described configuration is well-known in the art, its details will be omitted for simplicity.

Referring back to FIG. 10, the RBNB ESD protection circuit according to the second embodiment of the invention is provided with a rising time detector 210 in which a capacitor Clp is connected between the source of the PMOS transistor of the inverter Inv1 and Ndd in the configuration of FIG. 11. This configuration cuts off the leakage current flowing through the inverter Inv1 upon receipt of the power noise, as in the first embodiment.

Meanwhile, the pre-driver 220 and the power clamp 230 has the same configuration as the pre-driver 320 and the power clamp 330 of the conventional 2RC2Inv_std ESD protection circuit shown in FIG. 11. Thus, details thereof will be omitted.

Figure 12A:
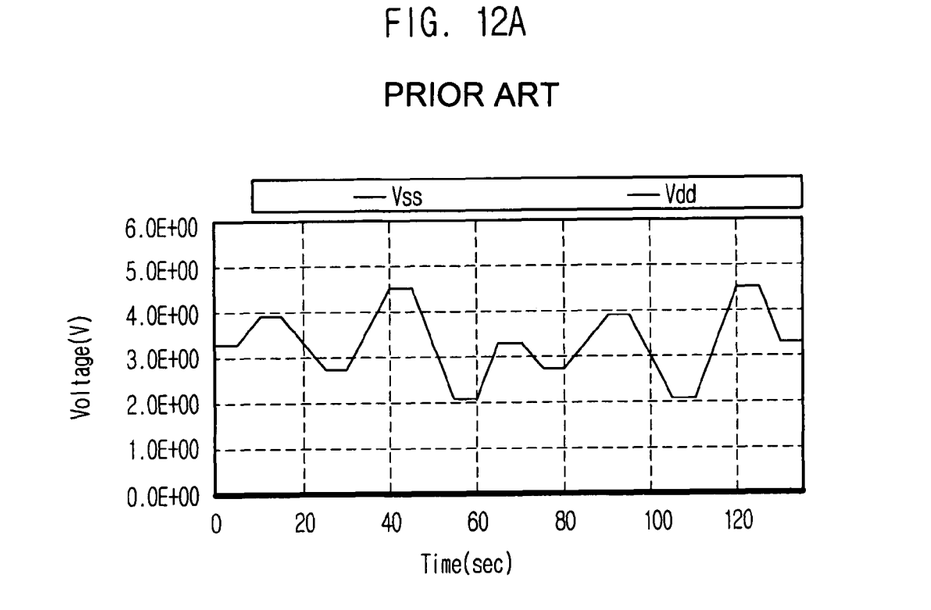
FIGS. 12A, 12B and 12C are views for describing leakage current characteristics of the 2RC2Inv_std ESD protection circuit shown in FIG. 11 against the power noise.
Figure 12B:
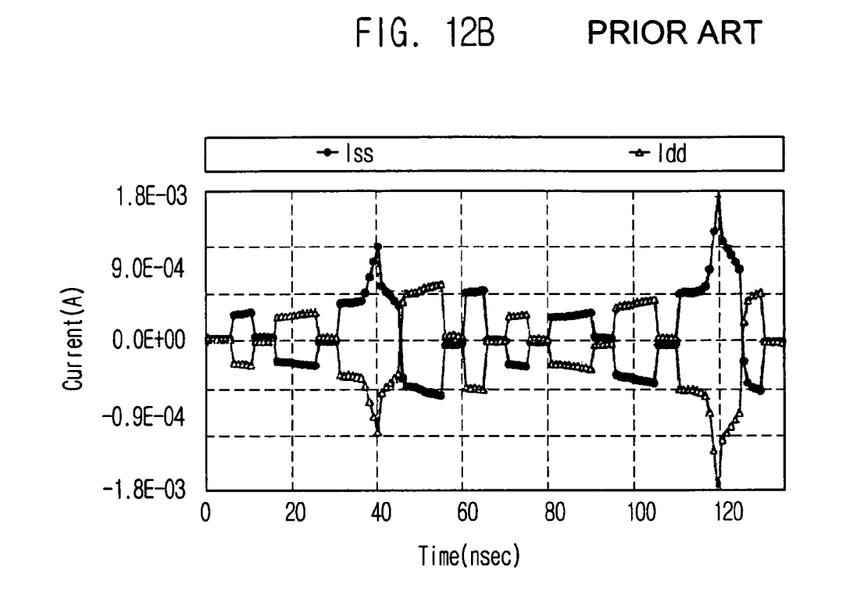
Figure 12C:
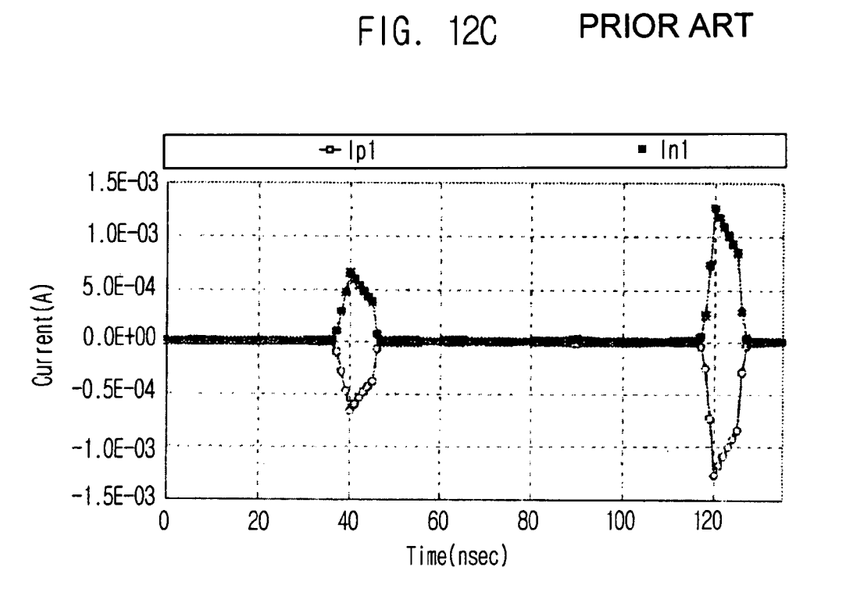
Figure 13A:
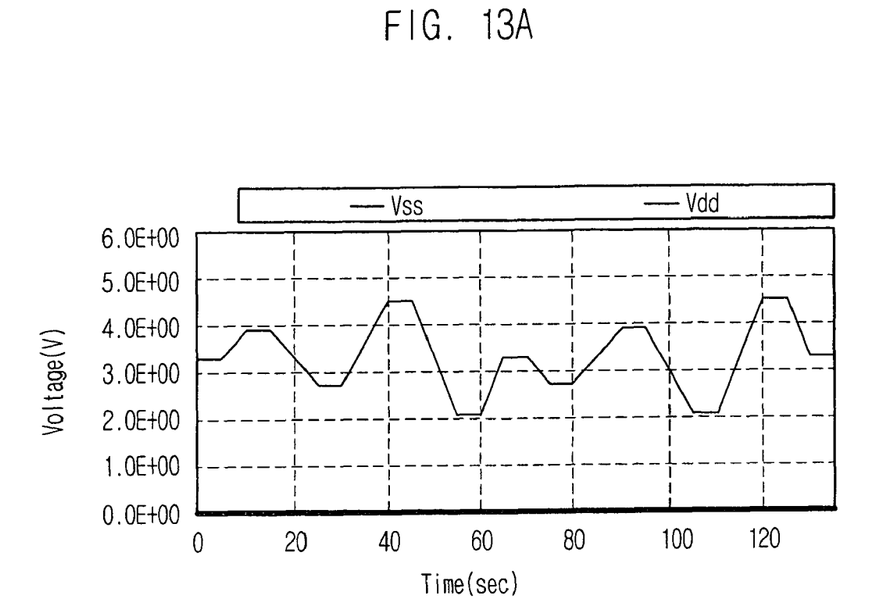
FIGS. 13A, 13B and 13C are views for describing leakage current characteristics of the 2RC2Inv_LPC ESD protection circuit shown in FIG. 10 against the power noise.
Figure 13B:
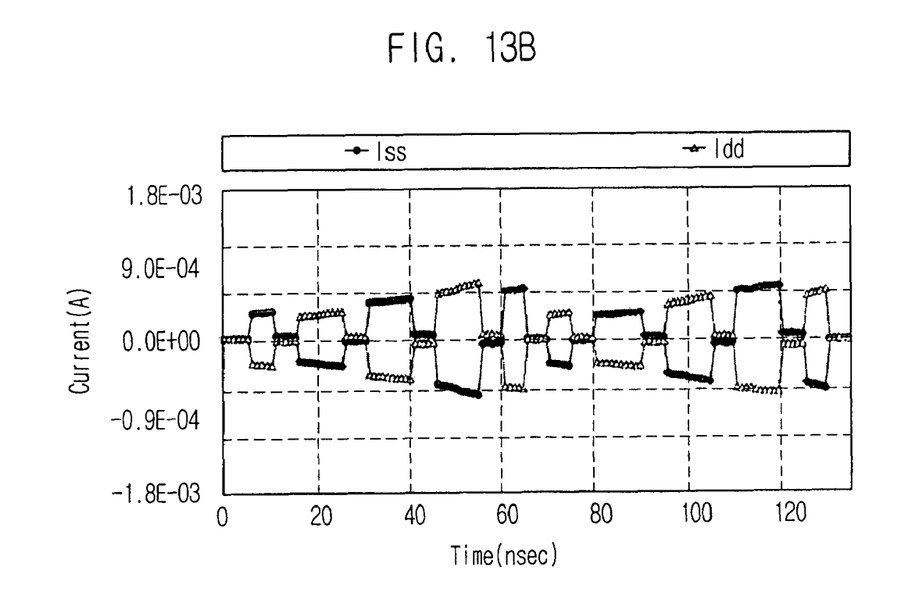
Figure 13C:
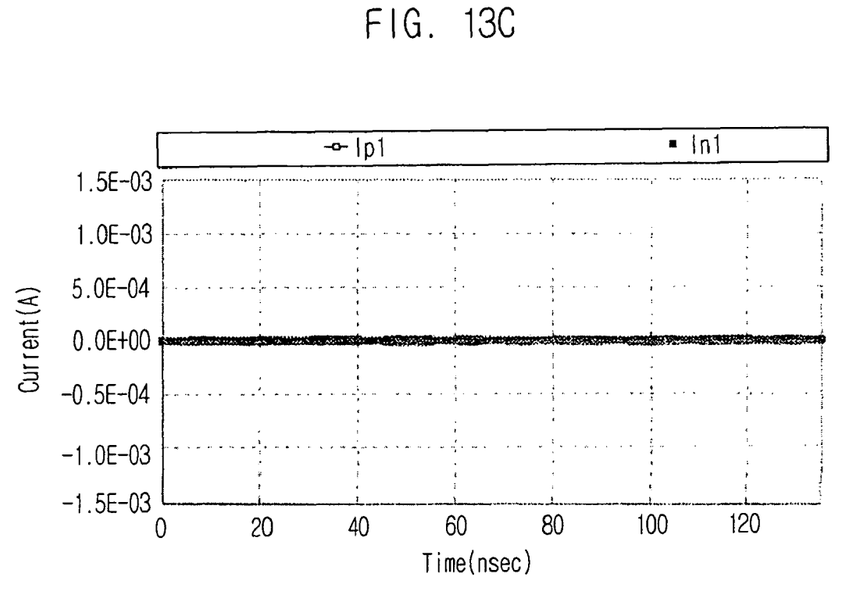

FIGS. 12A to 12C and FIGS. 13A to 13C are views for comparing the operational characteristics of the 2RC2Inv_std ESD protection circuit and the 2RC2Inv_LPC ESD protection circuit according to the second embodiment of the invention against the power noise. Here, FIGS. 12A to 12C are views showing reaction to the power noise of the 2RC2Inv_std ESD protection circuit, and FIGS. 13A to 13C are views showing reaction to the power noise of the 2RC2Inv_LPC ESD protection circuit (here, Clp=1.0 pF).

As shown in FIGS. 12A to 12C, the conventional 2RC2Inv_std ESD protection circuit can confirm that the leakage current occurs through the inverter Inv1 against the power noise. But, as depicted in FIG. 13, it can be confirmed that the 2RC2Inv_LPC ESD protection circuit according to the second embodiment of the invention additionally installs the capacitor Clp between Ndd and the source end of the PMOS transistor of the inverter Inv1, thereby generating no leakage current.

Figure 14A:
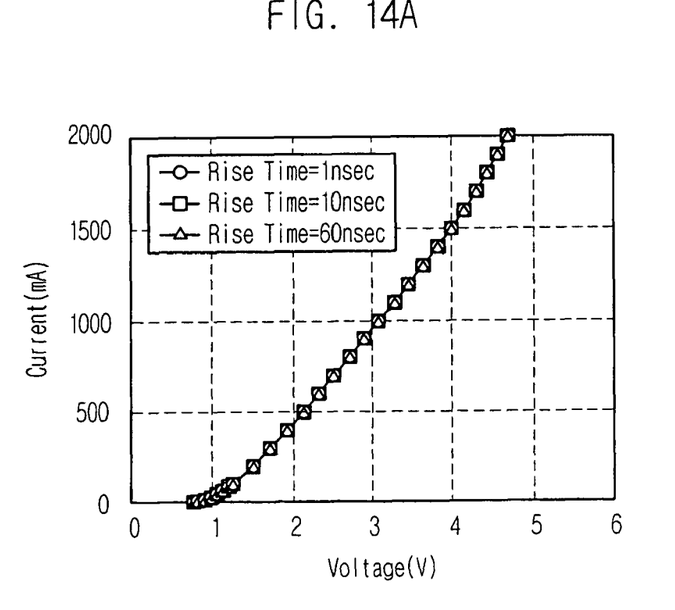
FIGS. 14A and 14B are views for describing operational characteristics of the 2RC2Inv_std ESD protection circuit shown in FIG. 11 under the ESD stress circumstance and the power ramp-up.
Figure 14B:
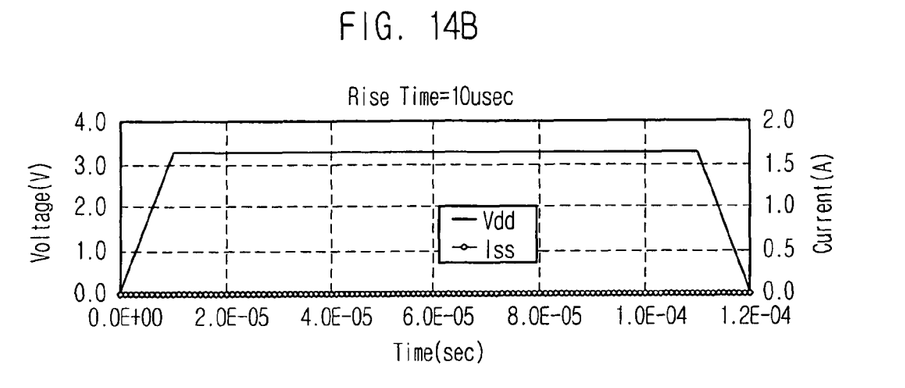
Figure 15A:
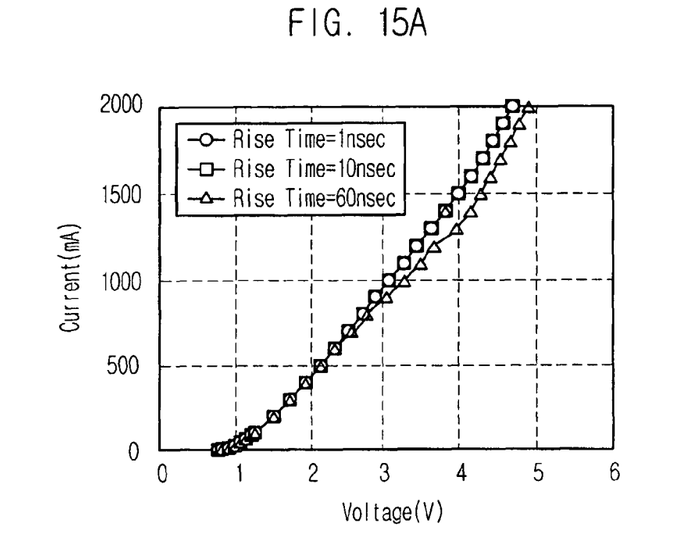
FIGS. 15A and 15B are views for describing operational characteristics of the 2RC2Inv_std ESD protection circuit shown in FIG. 10 under the ESD stress circumstance and the power ramp-up.
Figure 15B:
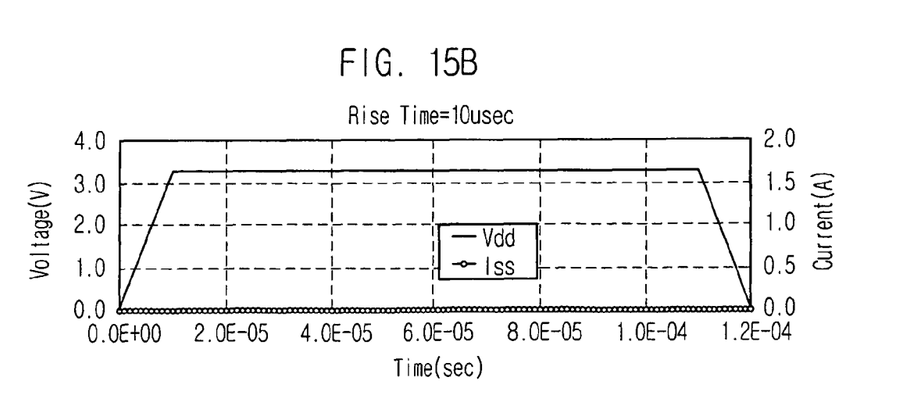

FIGS. 14A and 14B and FIGS. 15A and 15B are views for comparing the operational characteristics of the 2RC2Inv_std ESD protection circuit and the 2RC2Inv_LPC ESD protection circuit according to the second embodiment of the invention. Here, FIG. 14A is a view showing reaction to the ESD stress of the 2RC2Inv_std ESD protection circuit, and FIG. 14B is a view showing reaction to the power ramp-up. Further, FIG. 15A is a view showing reaction to the ESD stress of the 2RC2Inv_LPC ESD protection circuit (here, Clp=1.0 pF), and FIG. 15B is a view showing reaction to the power ramp-up.

As shown in FIGS. 14A and 14B and FIGS. 15A and 15B, it can be seen that the 2RC2Inv_LPC ESD protection circuit according to the second embodiment of the invention can also cope with the ESD stress current efficiently when it is flowed into the power line between the Ndd and Nss lines, as in the 2RC2Inv_std ESD protection circuit. Further, it can be confirmed that when the power is ramped-up in a power line between the Ndd and Nss lines, all of the two ESD protection circuits do not generate leakage current if the power ramp-up time is above 1 μs.

As set forth above, using the RBNB ESD protection circuit of the present invention, the following advantages can be obtained.

Firstly, the ESD protection circuit which properly operates under the ESD stress current and the normal operation circumstance can be implemented.

Secondly, the ESD protection circuit in which no leakage current flows against the power noise of a microchip can be implemented.

Accordingly, the low power and high quality microchip can be manufactured.

The present application contains subject matter related to Korean patent application No. 2005-109247, filed with the Korean Intellectual Property Office on Nov. 15, 2005, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:
1. An Electro-Static Discharge (ESD) protection circuit, comprising:
   a detection unit for detecting a rising time of a signal flowing into first and second power lines;
   a pre-driver including two or more second inverters for buffering an output signal of the detection unit; and
   a power clamp which operates in response to an output signal of the pre-driver and connects the first and second power lines with each other, wherein the detection unit includes:
   an RC filter connected in series between the first and the second power lines;
   a first inverter for inverting an output of the RC filter; and
   a first capacitor, directly connected between the first power line and a first transistor of the first inverter, for preventing a leakage current flowing through the first transistor and a second transistor of the first inverter when a power noise is applied to the first and second power lines.

2. The ESD protection circuit as recited in claim 1, wherein the RC filter is composed of a first resistor and a second capacitor connected in series between the first and the second power lines.

3. The ESD protection circuit as recited in claim 2, wherein the first inverter is connected between a first node, to which the first resistor and the second capacitor are connected, and the pre-driver.

4. The ESD protection circuit as recited in claim 3, wherein the first transistor is a PMOS transistor and the second transistor is an NMOS transistor.

5. The ESD protection circuit as recited in any one of claim 4, wherein the pre-driver is composed of two or more second inverters connected to an output end of the first inverter in a chain shape for buffering and outputting the output signal of the detection unit.

6. The ESD protection circuit as recited in any one of claim 4, wherein the pre-driver includes:
   a second resistor connected to the first power line;
   a third transistor, connected between the second resistor and the second power line, which operates in response to an output signal of the first inverter;
   a third capacitor connected in parallel to the second resistor between the first power line, and a second node to which the second resistor and the third transistor are connected; and
   a second inverter for inverting a voltage at the second node.

7. The ESD protection circuit as recited in claim 6, wherein a rising time of the power noise is varied at a speed faster than the RC time constant of the RC filter.

8. The ESD protection circuit as recited in claim 7, wherein the first capacitor has an electrostatic capacity greater than a net parasitic capacity of the first inverter.

9. The ESD protection circuit as recited in claim 8, wherein the power clamp is composed of a fourth transistor that is connected between the first and the second power lines and operates in response to an output signal of the pre-driver.

10. The ESD protection circuit as recited in claim 9, wherein the fourth transistor is an NMOS transistor.

11. The ESD protection circuit as recited in claim 9, wherein the fourth transistor is turned-on to form a current path between the first and the second power lines in order to correspond to an ESD stress current when an ESD stress current having a rising time that is less than the time constant of the RC filter and a duration that is less than or equal to the time constant is flowed into the first and the second power lines, in a state that a power is not applied between the first and the second power lines.

12. The ESD protection circuit as recited in claim 9, wherein the fourth transistor is kept in a turn-off state to cut off a current path between the first and the second power lines when a power that is ramped-up at a speed slower than the time constant of the RC filter is applied to the first and the second power lines, in a state that a power is not applied between the first and the second power lines.

13. The ESD protection circuit as recited in claim 9, wherein the fourth transistor is kept in a turn-off state to cut off a current path between the first and the second power lines when a power is applied between the first and the second power lines.

14. The ESD protection circuit as recited in claim 13, wherein the first capacitor blocks the leakage current caused by the first inverter when the rising time of the power noise varied at a speed faster than the time constant is applied to the first and the second power lines, in a state that a power is applied between the first and the second power lines.

15. The ESD protection circuit as recited in claim 1, wherein the power clamp is composed of a third transistor that is connected between the first and the second power lines and operates in response to an output signal of the pre-driver.

16. The ESD protection circuit as recited in claim 15, wherein the third transistor is an NMOS transistor.

17. The ESD protection circuit as recited in claim 15, wherein the third transistor is turned-on to form a current path between the first and the second power lines in order to correspond to the ESD stress current when an ESD stress current having a rising time that is less than the time constant of the RC filter and duration that is less than or equal to the time constant is flowed into the first and the second power lines, in a state that a power is not applied between the first and the second power lines.

18. The ESD protection circuit as recited in claim 15, wherein the third transistor is kept in a turn-off state to cut off a current path between the first and the second power lines when a power that is ramped-up at a speed slower than the time constant of the RC filter is applied to the first and the second power lines, in a state that a power is not applied between the first and the second power lines.

19. The ESD protection circuit as recited in claim 15, wherein the third transistor is kept in a turn-off state to cut off a current path between the first and the second power lines when a power that is ramped-up at a speed slower than the time constant of the RC filter is applied to the first and the second power lines for a predetermined time longer the time constant, in a state that a power is not applied between the first and the second power lines.

20. The ESD protection circuit as recited in claim 15, wherein the third transistor is kept in a turn-off state to cut off a current path between the first and the second power lines when a power is applied between the first and the second power lines.

21. The ESD protection circuit as recited in claim 20, wherein the first capacitor blocks the leakage current caused by the first inverter when a rising time of the power noise varied at a speed faster than the time constant is applied to the first and the second power lines, in a state that a power is applied between the first and the second power lines.

22. The ESD protection circuit as recited in claim 15, wherein the fourth transistor is kept in a turn-off state to cut off a current path between the first and the second power lines when a power that is ramped-up at a speed slower than the time constant of the RC filter is applied to the first and the second power lines for a predetermined time longer than the time constant, in a state that a power is not applied between the first and the second power lines.

* * * * *